US007710216B2

(12) United States Patent
Hamada et al.

(10) Patent No.: US 7,710,216 B2
(45) Date of Patent: May 4, 2010

(54) BALUN CIRCUIT AND INTEGRATED CIRCUIT DEVICE

(75) Inventors: Yasuhiro Hamada, Tokyo (JP); Keiichi Ohata, Tokyo (JP); Kenichi Maruhashi, Tokyo (JP); Takao Morimoto, Tokyo (JP); Masaharu Itou, Tokyo (JP); Shuuya Kishimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 94 days.

(21) Appl. No.: 12/088,173

(22) PCT Filed: Aug. 29, 2006

(86) PCT No.: PCT/JP2006/316944

§ 371 (c)(1), (2), (4) Date: Mar. 26, 2008

(87) PCT Pub. No.: WO2007/034658

PCT Pub. Date: Mar. 29, 2007

(65) Prior Publication Data

US 2009/0115548 A1 May 7, 2009

(30) Foreign Application Priority Data

Sep. 26, 2005 (JP) ............................ 2005-277553

(51) Int. Cl.
*H03H 7/42* (2006.01)
*H01P 3/08* (2006.01)

(52) U.S. Cl. ........................................ 333/26; 333/128

(58) Field of Classification Search ................... 333/25, 333/26, 128, 238, 248
See application file for complete search history.

(56) References Cited

U.S. PATENT DOCUMENTS 4,313,095 A * 1/1982 Jean-Frederic .............. 333/116
6,331,807 B1 * 12/2001 Prieto et al. ................. 333/128

FOREIGN PATENT DOCUMENTS

JP 63-136701 A 6/1988
JP 01-174106 A 7/1989
JP 09-246815 A 9/1997

(Continued)

OTHER PUBLICATIONS

Coplanar Waveguide-Fed Uniplanar Bow-Tie Antenna, Yu-De Lin and Syh-Nan Tsai, IEEE Transactions on Antennas and Propagation vol. 45 No. 2 Feb. 1997, pp. 306-306.

(Continued)

*Primary Examiner*—Dean O Takaoka
(74) *Attorney, Agent, or Firm*—Sughrue Mion, PLLC

(57) ABSTRACT

A balun circuit includes a first CPW line 11, a second CPW line 12*a*, and a third CPW line 12*b* that serve as signal input/output ports; a first CPS line 14*a* that is a differential transmission line, the first CPS line 14*a* relaying the first CPW line 11 to the second CPW line 12*a*; a second CPS line 14*b* that is a differential transmission line, the second CPS line 14*b* relaying the first CPW line 11 to the third CPW line 12*b*; and at least one connection section that connects grounded conductors of each of the first CPW line 11, the second CPW line 12*a*, and the third CPW line 12*b*.

19 Claims, 4 Drawing Sheets

FOREIGN PATENT DOCUMENTS

| | | | |
|---|---|---|---|
| JP | 10-163809 | A | 6/1998 |
| JP | 2000-299620 | A | 10/2000 |
| JP | 2000-357763 | A | 12/2000 |
| JP | 2002-141702 | A | 5/2002 |
| JP | 2003-066394 | A | 3/2003 |
| JP | 2004-163859 | A | 6/2004 |
| WO | WO 2008114646 | A1 * | 9/2008 |

OTHER PUBLICATIONS

Mu-Jung Hsieh et al., "Broadband mm-wave Schottky diode frequency doubler using a broadband CPW balun," Department of Communication Engineering, National Chiao-Tung University, Hsin-Chu, Taiwan, R.O.C., Feb. 2004, pp. 1-4.

* cited by examiner

BALUN CIRCUIT AND INTEGRATED CIRCUIT DEVICE

TECHNICAL FIELD

The present invention relates to a balun circuit that is preferable when used in an integrated circuit device and an integrated circuit device including the balun circuit.

BACKGROUND ART

In a wireless communication apparatus, a mixer circuit is typically used to carry out frequency conversion from an IF (Intermediate Frequency) signal for signal processing, which uses a relatively low frequency, into an RF (Radio Frequency) signal for communication, which uses a relatively high frequency, or frequency conversion from the RF signal into the IF signal.

FIG. 1 is a circuit diagram showing the configuration of a single-balanced mixer circuit used in a wireless communication apparatus and the like.

As shown in FIG. 1, the single-balanced mixer circuit includes two mixer elements 51 and 180-degree phase combination circuit 52. Mixer elements 51 mix two opposite-phase IF signals (differential signals) with two in-phase local oscillation signals (hereinafter referred to as LO signals), and outputs an upper sideband signal and a lower sideband signal necessary for communication.

In 180-degree phase combination circuit 52, two input signals are combined with a 180-degree phase difference therebetween and the combined signal is outputted. Therefore, the upper sideband signal and the lower sideband signal, which mixer elements 51 have produced from the two differential IF signals, undergo in-phase combination in 180-degree phase combination circuit 52, and a resultant RF signal used in communication is outputted. Mixer elements 51 also output LO signals that are unnecessary for communication. The two in-phase LO signals inputted to mixer elements 51 are outputted as in-phase signals, the output signals undergo opposite-phase combination in 180-degree phase combination circuit 52, so that they are cancelled and removed.

Further, 180-degree phase combination circuit 52 shown in FIG. 1 can also be used as a 180-degree phase splitter by inputting a signal to the output port (Output) and taking out signals from the input ports (0, 180). In this case, by inputting RF signals and LO signals to the mixer elements, two IF signals in which the phase of one of which differs from the other by 180 degrees, can be obtained. Such a circuit that splits or combines signals with a 180-degree phase difference therebetween is used in various applications, such as a circuit that converts differential signals into non-differential signals or converts non-differential signals into differential signals, a circuit that splits differential signals to a plurality of active elements, and a circuit that combines differential signals. Therefore, there has recently been an increasing demand to use the 180-degree phase combination circuit (180-degree phase splitter) in microwave ICs used in a wireless communication apparatus and the like. In a microwave IC, a CPW (Coplanar Waveguide) line has been widely used as a transmission line because no backside processing of the substrate is required.

To split high-frequency signals and impart a 180-degree phase difference to the two split signals, a rat race circuit is typically used. A rat race circuit is a circuit in which a signal line is split into two to split signals in such a way that the split two signal lines are different in length by half the wavelength of the frequency of the signal to be transmitted so as to impart a 180-degree phase difference to the two split signals.

However, the line length corresponding to half the wavelength of the signal frequency ranges from several millimeters to several centimeters even in the case of a high-frequency signal on the order of GHz or higher, and such a length requires a large circuit footprint. It is therefore difficult to incorporate a rat race circuit in a microwave IC.

To address the above problem, instead of using the difference in line length to provide a phase difference, there is a method for providing a 180-degree phase difference by using a balun circuit that converts a non-differential transmission line, such as the CPW line described above and a microstrip line, into a differential transmission line, such as a slot line and a CPS (Coplanar Strips) line, or a balun circuit that converts a differential transmission line into a non-differential transmission line. Such a method is proposed in non-patent document 1 (Mu-Jung Hsieh, Chun-Yi Wu, Chi-Yang Chang, and Dow-Chin Niu, "Broadband mm-wave Schottky diode frequency doubler using a broadband CPW balun", The 6th topical symposium on millimeter waves (TSMMW 2004) technical digest, pp. 285-288, February 2004).

As shown in FIG. 2, the balun circuit described in non-patent document 1 includes first FCPW (Finite Ground Coplanar Waveguide) line 61, second FCPW line 62*a*, and third FCPW line 62*b*, which serve as signal input/output ports; first CPS line 64*a* and second CPS line 64*b*, which are differential transmission lines; FCPW-CPS converter/splitter 65 that converts first FCPW line 61 into first CPS line 64*a* and second CPS line 64*b*; first CPS-FCPW converter 67*a* that converts first CPS line 64*a* into second FCPW line 62*a*; and second CPS-FCPW converter 67*b* that converts second CPS line 64*b* into third FCPW line 62*b*, all of which are formed on substrate 69.

First FCPW line 61, second FCPW line 62*a*, and third FCPW line 62*b* are non-differential transmission lines, each including a center conductor and two grounded conductors disposed in such a way that they sandwich the center conductor. The grounded conductors, two in each of first FCPW line 61, second FCPW line 62*a*, and third FCPW line 62*b*, are connected to each other via air bridge 68.

In the balun circuit shown in FIG. 2, FCPW-CPS converter/splitter 65 splits and converts first FCPW line 61 into first CPS line 64*a* and second CPS line 64*b*. First CPS-FCPW converter 67*a* converts first CPS line 64*a* into second FCPW line 62*a*, and second CPS-FCPW converter 67*b* converts second CPS line 64*b* into third FCPW line 62*b*. The center conductor of second FCPW line 62*a* is connected to the center conductor of first FCPW line 61, and the center conductor of third FCPW line 62*b* is connected to the grounded conductor of first FCPW line 61. The grounded conductor of second FCPW line 62*a* is connected to the grounded conductor of first FCPW line 61, and the grounded conductor of third FCPW line 62*b* is connected to the center conductor of first FCPW line 61.

By thus reversing the connection of the center conductor and the grounded conductor of second FCPW line 62*a* with the center conductor and the grounded conductor of first FCPW line 61 with respect to the connection of the center conductor and the grounded conductor of third FCPW line 62*b* with the center conductor and the grounded conductor of first FCPW line 61, a signal inputted to first FCPW line 61 becomes differential signals in which the phase of one differs from the other by 180 degrees. The differential signals are outputted from second FCPW line 62*a* and third FCPW line 62*b*.

In non-patent document 1, the length of each of first CPS line 64*a* and second CPS line 64*b* coincides with one-fourth the wavelength of the signal frequency. However, since the balun circuit shown in FIG. 2 does not provide a phase difference based on the line length unlike a rat race circuit, the length of each of first CPS line 64*a* and second CPS line 64*b* does not necessarily coincide with one-fourth the wavelength of the signal frequency.

In the balun circuit described in non-patent document 1 described above, since the grounded conductors of the first FCPW line, the second FCPW line, and the third FCPW line are not interconnected, the potentials thereof will not always be the same. In non-patent document 1, a frequency multiplier that multiplies the frequency of an input signal is configured by using the balun circuit shown in FIG. 2 as a 180-degree phase splitter, connecting a diode, which is a two-terminal element, to each of the second FCPW line and the third FCPW line, and combining the outputs of the diodes. In such a circuit configuration, different potentials of the grounded conductors of the FCPW lines will not particularly be a problem.

However, when a single-balanced mixer circuit shown in FIG. 3 is configured by using the balun circuit, for example, shown in FIG. 2 as a 180-degree phase combination circuit and by connecting a three-terminal active element, such as an FET, used as a mixer element, to each of the second FCPW line and the third FCPW line, the following problem will occur.

In the single-balanced mixer circuit shown in FIG. 3, the source electrode of one of FETs 71*a* is connected to the grounded conductor of the second FCPW line, and the source electrode of the other FET 71*b* is connected to the grounded conductor of the third FCPW line. Each of the gate electrodes of two FETs 71*a* and 71*b* is connected to an LO signal source and a bias (Vg) source. The center conductor of the second FCPW line is connected to the drain electrode of FET 71*a* via capacitor 72*a*, and the center conductor of the third FCPW line is connected to the drain electrode of FET 71*b* via capacitor 72*b*.

The drain electrode of FET 71*a* is connected not only to capacitor 73*a,* the other end of which is connected to the grounded conductor, but also to a stub having a predetermined length, and an (opposite phase) IF signal is supplied through the stub. Similarly, the drain electrode of FET 71*b* is connected not only to capacitor 73*b*, the other end of which is connected to the grounded conductor, but also to a stub having a predetermined length, and an IF signal is supplied through the stub The capacitance (impedance) of each of s capacitors 73*a* and 73*b* is open when viewed from the drain electrode side at the frequency of the RF signal, and is set to a value at which the insertion loss is minimized at the frequency of the IF signal.

In such a configuration, an upper sideband signal, a lower sideband signal, and LO signals are outputted from the drain electrodes of FETs 71*a* and 71*b*, each of which is a mixer element, The upper sideband signal and the lower sideband signal undergo in-phase combination in the balun circuit, and the LO signals undergo opposite-phase combination in the balun circuit.

However, in the configuration shown in FIG. 3, the source electrodes of two FETs 71*a* and 71*b*, which should normally be grounded have different potentials at connection sections 74*a* and 74*b*, so that the operation conditions of FETs 71*a* and 71*b* are disadvantageously different from each other.

The electric power of the LO signal outputted from FET 71*a* is thus not the same as that of the LO signal outputted from FET 71*b*. Therefore, when the LO signals having different electric power values undergo opposite-phase combination in the balun circuit, the LO signals will not be cancelled, but the combined LO signal having a large electric power is outputted from the first FCPW line. Therefore, desired circuit performance cannot be achieved.

DISCLOSURE OF THE INVENTION

An object of the present invention is to provide a balun circuit that can split or combine signals in which the phase of one differs from the other by 180 degrees, and can be easily incorporated in an integrated circuit device while achieving desired circuit performance, as well as an integrated circuit device including such a balun circuit.

To achieve the above object, the balun circuit of the present invention includes a first CPW line, a second CPW line, and a third CPW line that serve as signal input/output ports; a first CPS line that is a differential transmission line, the first CPS line relaying the first CPW line to the second CPW line; a second CPS line that is a differential transmission line, the second CPS line relaying the first CPW line to the third CPW line; and a connection section that connects the grounded conductors of one or more of the following lines, the first CPW line, the second CPW line, and the third CPW line.

Alternatively, the balun circuit includes a first CPW line, a second CPW line, and a third CPW line that serve as signal input/output ports; a first CPS line that is a differential transmission line, the first CPS line relaying a center conductor of the second CPW line to a center conductor of the first CPW line and relaying a grounded conductor of the second CPW line to a grounded conductor of the third CPW line; a second CPS line that is a differential transmission line, the second CPS line relaying a center conductor of the third CPW line to a grounded conductor of the first CPW line and relaying the grounded conductor of the third CPW line to the grounded conductor of the second CPW line; and a connection section that connects the grounded conductors of one or more of the following lines, the first CPW line, the second CPW line, and the third CPW line.

Alternatively, the balun circuit includes a first CPW line, a second CPW line, and a third CPW line that serve as signal input/output ports; a first CPS line that is a differential transmission line, the first CPS line relaying a center conductor of the second CPW line to a center conductor of the third CPW line and relaying a grounded conductor of the second CPW line to a center conductor of the first CPW line; a second CPS line that is a differential transmission line, the second CPS line relaying the center conductor of the third CPW line to the center conductor of the second CPW line and relaying a grounded conductor of the third CPW line to a grounded conductor of the first CPW line; and a connection section that connects the grounded conductors of one or more of the following lines, the first CPW line, the second CPW line, and the third CPW line.

In general, when a CPS line is split into two CPS lines, opposite-phase signals are split to the two split lines. Therefore, only by converting the CPS lines into CPW lines in such a way that a conductor common to the two split CPS lines becomes center conductors of the CPW lines or a conductor common to the two split CPS lines becomes grounded conductors of the CPW lines, the two CPW lines provide opposite-phase signals.

When in-phase signals are split to two CPS lines and two conductors of the CPS lines are connected to two CPW lines, by reversing the connection of the two conductors of one of the two CPS lines with a center conductor and a grounded conductor of one of two CPW lines with respect to the connection of the two conductors of the other CPS line with a center conductor and a grounded conductor of the other CPW line, the two CPW lines output opposite-phase signals.

A CPS line, which is a differential transmission line, does not require a wide conductor that a slot line requires, which is another type of differential transmission line, so that the circuit size can be reduced.

Therefore, by using the above connection relationship of the two conductors of the first CPS line and the two conductors of the second CPS line with respect to a center conductor and a grounded conductor of the first CPW line, a center conductor and a grounded conductor of the second CPW line and a center conductor and a grounded conductor of the third CPW line, the second CPW line and the third CPW line can provide differential signals in which the phase of one differs from the other by 180 degrees.

Further, by connecting the grounded conductor of the first CPW line, the grounded conductor of the second CPW line, and the grounded conductor of the third CPW line using a connection section, the grounded conductors of the first CPW line, the second CPW line, and the third CPW line have the same potential. Therefore, when a three-terminal active element or the like is connected to the first CPW line, the second CPW line, and the third CPW line, desired circuit performance can be achieved.

Moreover, since the balun circuit can be reduced in size, the balun circuit can be easily incorporated in an integrated circuit device, and hence the circuit size of the integrated circuit device including the balun circuit can be reduced.

BEST MODE FOR CARRYING OUT THE INVENTION

First Exemplary Embodiment

Figure 4:
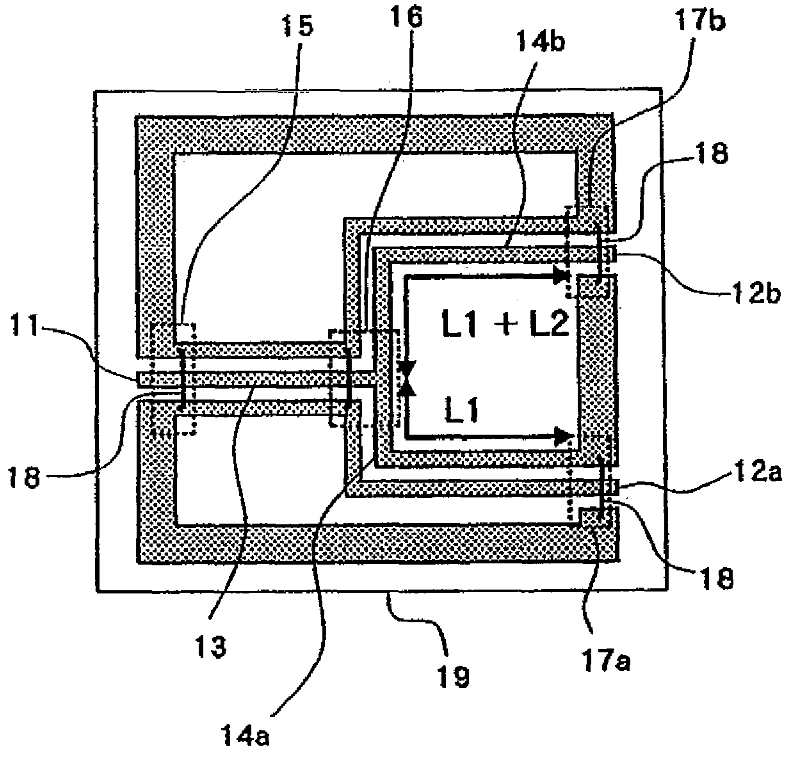
FIG. 4 is a plan view showing the configuration of a first exemplary embodiment of the balun circuit according to the present invention.

As shown in FIG. 4, the balun circuit of a first exemplary embodiment includes first CPW line 11, second CPW line 12*a*, and third CPW line 12*b*, which serve as signal input/output ports; FCPW line 13, which is a non-differential transmission line; CPW-FCPW line converter 15 that converts first CPW line 11 into FCPW line 13; first CPS line 14*a* having a length of L1 and second CPS line 14*b* having a length of L1+L2, which are differential transmission lines; FCPW-CPS converter/splitter 16 that converts FCPW line 13 into first CPS line 14*a* and second CPS line 14*b*; first CPS-CPW converter 17*a* that converts first CPS line 14*a* into second CPW line 12*a*; and second CPS-CPW converter 17*b* that converts second CPS line 14*b* into third CPW line 12*b*, all of which are formed on substrate 19.

First CPS line 14*a* and second CPS line 14*b*, each including two conductors, share one conductor, and the common conductor is connected to the grounded conductor of second CPW line 12*a* and the center conductor of third CPW line 12*b*. The other conductor of first CPS line 14*a*, which is not the common conductor, is connected to the center conductor of second CPW line 12*a*, and the other conductor of second CPS line 14*b*, which is not the common conductor, is connected to the grounded conductor of third CPW line 12*b*.

The grounded conductors of first CPW line 11, second CPW line 12*a*, and third CPW line 12*b* are disposed in such a way that each of the grounded conductors surrounds elements formed on substrate 19. The grounded conductors of each of first CPW line 11, second CPW line 12*a*, third CPW line 12*b*, and FCPW line 13 are connected to each other via air bridge 18.

Therefore, the grounded conductors of first CPW line 11, second CPW line 12*a*, third CPW line 12*b*, and FCPW line 13 have the same potential.

In the balun circuit of the first exemplary embodiment shown in FIG. 4, the T splitter (FCPW-CPS converter/splitter 16) removes one of the grounded conductors of FCPW line 13 to form first CPS line 14*a*, and removes the other conductor of FCPW line 13 to form second CPS line 14*b*. Therefore, the same electric power is split to first CPS line 14*a* and second CPS line 14*b*.

As described above, the conductor common to first CPS line 14*a* and second CPS line 14*b* is the grounded conductor in second CPW line 12*a* and the center conductor in third CPW line 12*b*. Therefore, when the length of first CPS line 14*a* is equal to that of second CPS line 14*b* (L2=0), first CPS line 14*a* and second CPS line 14*b* should provide signals in which the phase of differs from the other by 180 degrees.

However the present inventor has found that when first CPW line 11 is used as an input port and second CPW line 12*a* and third CPW line 12*b* are used as output ports, connecting the grounded conductors of first CPW line 11, second CPW line 12*a*, and third CPW line 12*b* to one another and connecting each of the CPW lines to another integrated circuit device including a CPW line may result in a situation in which the phase difference between the signals outputted from second CPW line 12*a* and third CPW line 12*b* is not 180 degrees, and the same signal electric power is not split to first CPS line 14*a* and second CPS line 14*b*. It can be inferred that such a situation occurs because the condition of the conversion from first CPS line 14*a* into second CPW line 12*a* differs from the condition of the conversion from second CPS line 14*b* into third CPW line 12*b*.

Therefore, in this exemplary embodiment, the phase difference is compensated by setting the length of first CPS line 14*a* to be different from the length of second CPS line 14*b* in such a way that second CPW line 12*a* and third CPW line 12*b* output signals in which the phase of one differs from the other by 180 degrees. In this exemplary embodiment, since the phase difference between the signals outputted from second CPW line 12*a* and third CPW line 12*b* is compensated by using the value of L2, the length L1 can be freely set as long as the resultant footprint is acceptable. That is, the circuit size of the balun circuit shown in FIG. 4 can be reduced, so that the balun circuit can easily be incorporated in an integrated circuit device. The ratio of the signal electric power split to first CPS line 14*a* to that split to second CPS line 14*b* can be corrected by optimizing the shapes of the grounded conductors disposed at the periphery.

According to the balun circuit of the first exemplary embodiment, providing first CPS line 14*a*, which is a differential transmission line that relays first CPW line 11 to second CPW line 12*a*, and providing second CPS line 14*b*, which is a differential transmission line that relays first CPW line 11 to third CPW line 12*b*, allows second CPW line 12*a* and third CPW line 12*b* to output differential signals in which the phase of one differs from the other by 180 degrees.

Further, since the grounded conductors of first CPW line 11, second CPW line 12*a*, and third CPW line 12*b*, which serve as signal input/output ports, have the same potential, three-terminal active elements or the like connected to first CPW line 11, second CPW line 12*a*, and third CPW line 12*b* operate in the same condition, so that the desired circuit performance can be achieved. Moreover, since the area of the balun circuit can be reduced, the balun circuit can easily be incorporated in an integrated circuit device.

Second Exemplary Embodiment

Figure 5:
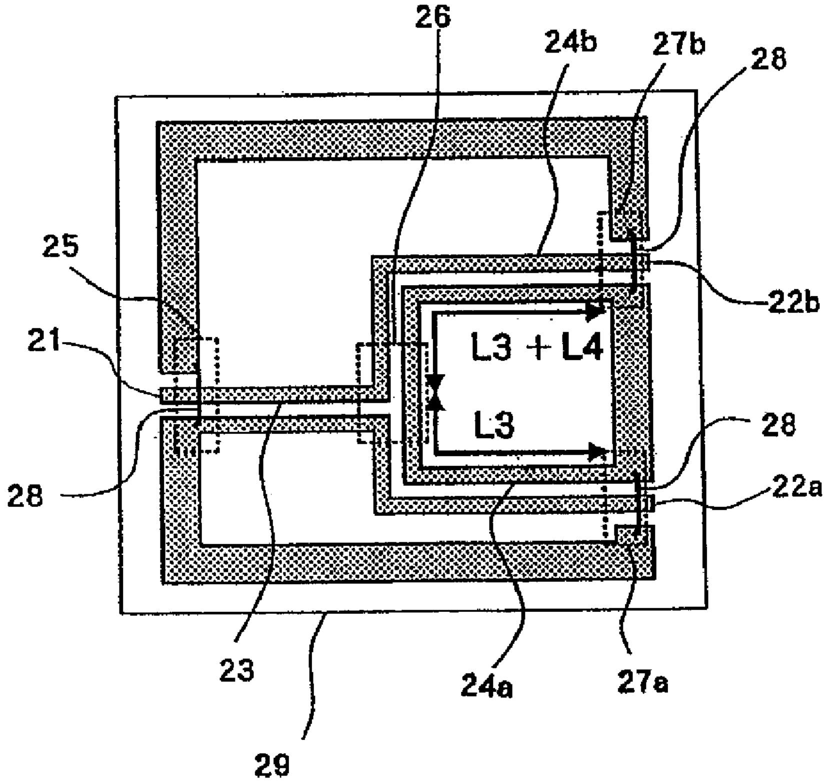
FIG. 5 is a plan view showing the configuration of a second exemplary embodiment of the balun circuit according to the present invention.

As shown in FIG. 5, the balun circuit of a second exemplary embodiment includes first CPW line 21, second CPW line 22*a*, and third CPW line 22*b*, which serve as signal input/output ports; first CPS line 24*a* having a length of L3 and second CPS line 24*b* having a length of L3+L4, which are differential transmission lines; CPW-CPS line converter 25 that converts first CPW line 21 into third CPS line 23; splitter 26 that splits third CPS line 23 into first CPS line 24*a* and second CPS line 24*b*; first CPS-CPW converter 27*a* that converts first CPS line 24*a* into second CPW line 22*a*; and second CPS-CPW converter 27*b* that converts second CPS line 24*b* into third CPW line 22*b*, all of which are formed on substrate 29.

First CPS line 24*a* and second CPS line 24*b*, each including two conductors, share one conductor, and the common conductor is connected to the grounded conductor of second CPW line 22*a* and the grounded conductor of third CPW line 22*b*. The other conductor of first CPS line 24*a*, which is not the common conductor, is connected to the center conductor of second CPW line 22*a*, and the other conductor of second CPS line 24*b*, which is not the common conductor, is connected to the center conductor of third CPW line 22*b*.

The grounded conductors of first CPW line 21, second CPW line 22*a*, and third CPW line 22*b* are disposed in such a way that each of the grounded conductors surrounds elements. The grounded conductors of each of first CPW line 21, second CPW line 22*a*, and third CPW line 22*b* are connected to each other via air bridge 28. Therefore, the grounded conductors of first CPW line 21, second CPW line 22*a*, and third CPW line 22*b* have the same potential.

In the balun circuit of the second exemplary embodiment shown in FIG. 5, the T splitter (splitter 26) splits opposite-phase signals having the same electric power to first CPS line 24*a* and second CPS line 24*b*. Since the conductor common to first CPS line 24*a* and second CPS line 24*b* is the grounded conductor in second CPW line 22*a* and third CPW line 22*b*, second CPW line 22*a* and third CPW line 22*b* should output signals in which the phase of one of which differs from the other by 180 degrees, when the length of first CPS line 24*a* is equal to that of second CPS line 24*b* (L4=0).

However, when first CPW line 21 is used as an input port and second CPW line 22*a* and third CPW line 22*b* are used as output ports, connecting the grounded conductors of first CPW line 21, second CPW line 22*a*, and third CPW line 22*b* to one another and connecting each of the CPW lines to another integrated circuit device including a CPW line may result in a situation in which the phase difference between the signals outputted from second CPW line 22*a* and third CPW line 22*b* is not 180 degrees, and the same power of the electrical signal electric is not split to first CPS line 24*a* and second CPS line 24*b*, as in the first exemplary embodiment.

Therefore, in this exemplary embodiment, the phase difference is compensated by setting the length of first CPS line 24*a* to be different from the length of second CPS line 24*b* in such a way that second CPW line 22*a* and third CPW line 22*b* output signals in which the phase of one differs from the other by 180 degrees. In this exemplary embodiment, since the phase difference between the signals outputted from second CPW line 22*a* and third CPW line 22*b* is compensated by using the value of L4, the length L3 can be freely set as long as the resultant footprint is acceptable. That is, the circuit size of the balun circuit shown in FIG. 5 can be reduced, so that the balun circuit can easily be incorporated in an integrated circuit device, as in the first exemplary embodiment.

The ratio of the signal electric power split to first CPS line 24*a* to that split to second CPS line 24*b* can be corrected by optimizing the shapes of the grounded conductors disposed at the periphery, as in the first exemplary embodiment.

In FIG. 5, although the conductor common to first CPS line 24*a* and second CPS line 24*b* is connected to the grounded conductors of second CPW line 22*a* and third CPW line 22*b*, the conductor common to first CPS line 24*a* and second CPS line 24*b* may be connected to the center conductors of second CPW line 22*a* and third CPW line 22*b*. In this case, the other conductor of first CPS line 24*a*, which is not the common conductor, may be connected to the grounded conductor of second CPW line 22*a*, and the other conductor of second CPS line 24*b*, which is not the common conductor, may be connected to the grounded conductor of third CPW line 22*b*.

According to the balun circuit of the second exemplary embodiment, providing first CPS line 24*a*, which is a differential transmission line that relays first CPW line 21 to second CPW line 22*a*, and providing second CPS line 24*b*, which is a differential transmission line that relays first CPW line 21 to third CPW line 22*b*, allows second CPW line 22*a* and third CPW line 22*b* to output differential signals in which the phase of one differs from the other by 180 degrees, as in the first exemplary embodiment.

Further, since the grounded conductors of first CPW line 21, second CPW line 22*a*, and third CPW line 22*b*, which serve as signal input/output ports, have the same potential, three-terminal active elements or the like connected to first CPW line 21, second CPW line 22*a*, and third CPW line 22*b* operate in the same condition, so that the desired circuit performance can be achieved.

Moreover, since the area of the balun circuit can be reduced, the balun circuit can be easily incorporated in an integrated circuit device.

Third Exemplary Embodiment

Figure 6:
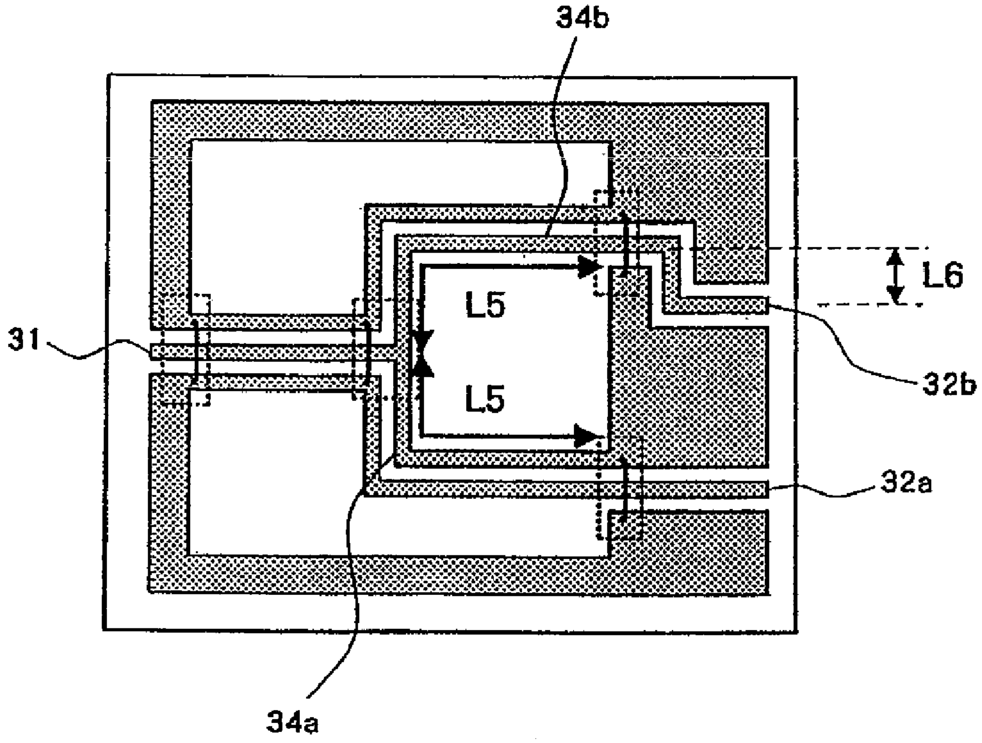
FIG. 6 is a plan view showing the configuration of a third exemplary embodiment of the balun circuit according to the present invention.

As shown in FIG. 6, the balun circuit of a third exemplary embodiment differs from the balun circuit of the first exemplary embodiment in that the length of first CPS line 34*a* is equal to that of second CPS line 34*b* (L5) and the length of second CPW line 32*a* differs from that of third CPW line 32*b* (the difference is L6). Since the other portions are configured in the same manner as in the first exemplary embodiment, the description thereof will be omitted.

In the balun circuit of the third exemplary embodiment, the phase difference is compensated by setting the length of second CPW line 32*a* to be different from the length of third CPW line 32*b* in such a way that second CPW line 32*a* and third CPW line 32*b* output signals in which the phase of one differs from the other by 180 degrees.

In this exemplary embodiment, since the phase difference between the signals outputted from second CPW line 32*a* and third CPW line 32*b* is compensated by using the value of L6, the length of first CPS line 34*a* and second CPS line 34*b* (L5) can be freely set as long as the resultant footprint is acceptable. That is, the circuit size of the balun circuit shown in FIG. 6 can be reduced, so that the balun circuit can be easily incorporated in an integrated circuit device, as in the first and second exemplary embodiments. Therefore, in the balun circuit of the third exemplary embodiment as well, the same advantageous effect as those provided in the first and second exemplary embodiments can be provided.

The third exemplary embodiment shows that the phase difference between the signals outputted from second CPW line 32*a* and third CPW line 32*b* can be compensated by setting the length of second CPW line 32*a* to be different from the length of third CPW line 32*b*. Therefore, the length of first CPS line 34*a* is not necessarily equal to that of second CPS line 34*b*, but these lengths may be different from each other.

Although FIG. 6 shows an example in which the phase difference between the signals outputted from the second CPW line and the third CPW line is compensated by setting the length of the second CPW line to be different from the length of the third CPW line in the balun circuit shown in the first exemplary embodiment, such a configuration is applicable to the balun circuit of the second exemplary embodiment. That is, the phase difference between the signals outputted from the second CPW line and the third CPW line, in FIG. 5, can be compensated by setting the length of the first CPS line to be equal to that of the second CPS line and by setting the length of the second CPW line to be different from that of the third CPW line.

Fourth Exemplary Embodiment

Figure 1:
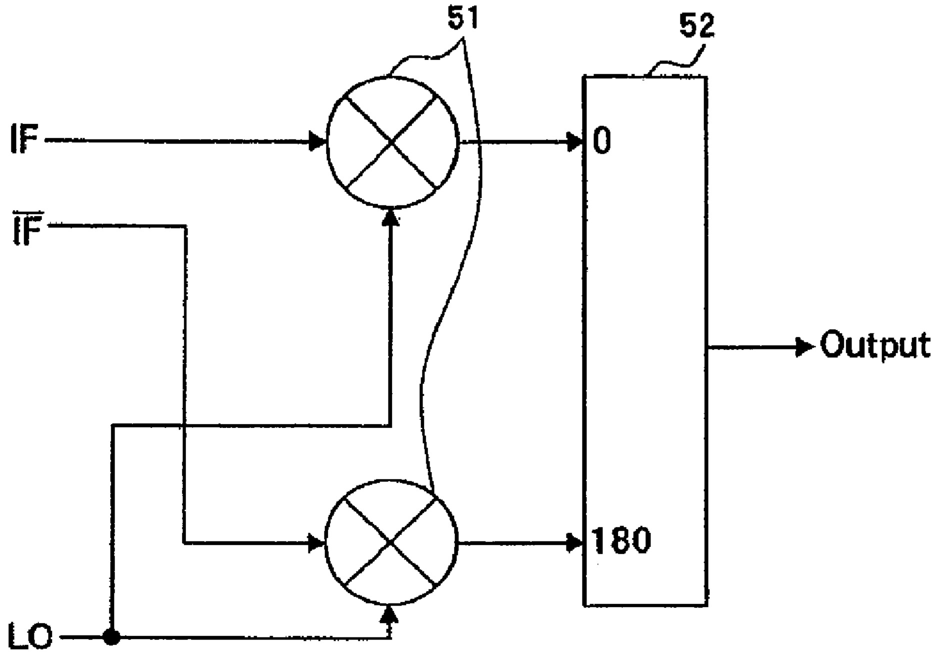
FIG. 1 is a circuit diagram showing the configuration of a single-balanced mixer circuit.
Figure 2:
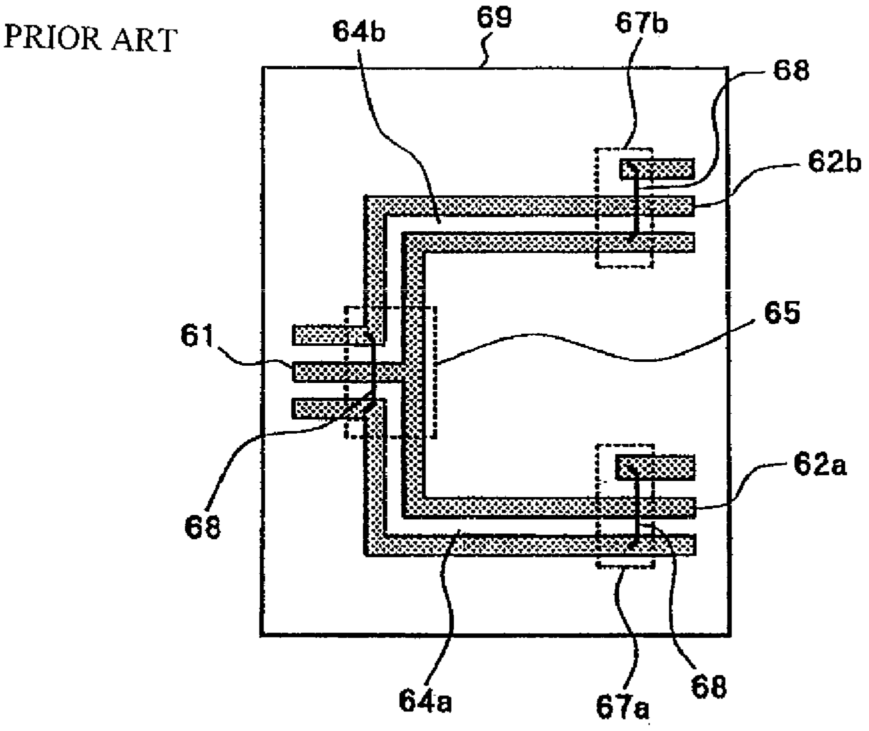
FIG. 2 PRIOR ART
FIG. 2 is a plan view showing the configuration of a balun circuit of related art.
Figure 3:
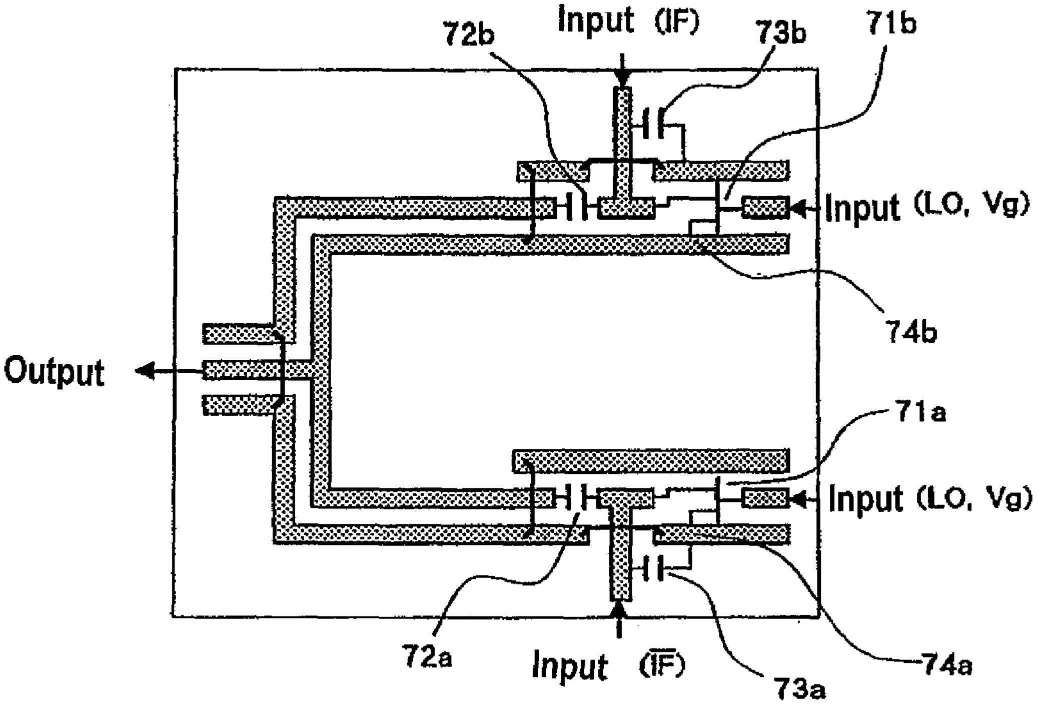
FIG. 3 is a plan view showing an example in which the balun circuit is shown in FIG. 2 is used in the single-balanced mixer circuit shown in FIG. 1.

A fourth exemplary embodiment is an example in which the balun circuit of the first exemplary embodiment is used as a 180-degree phase combination device in the single-balanced mixer circuit shown in FIG. 1.

Figure 7:
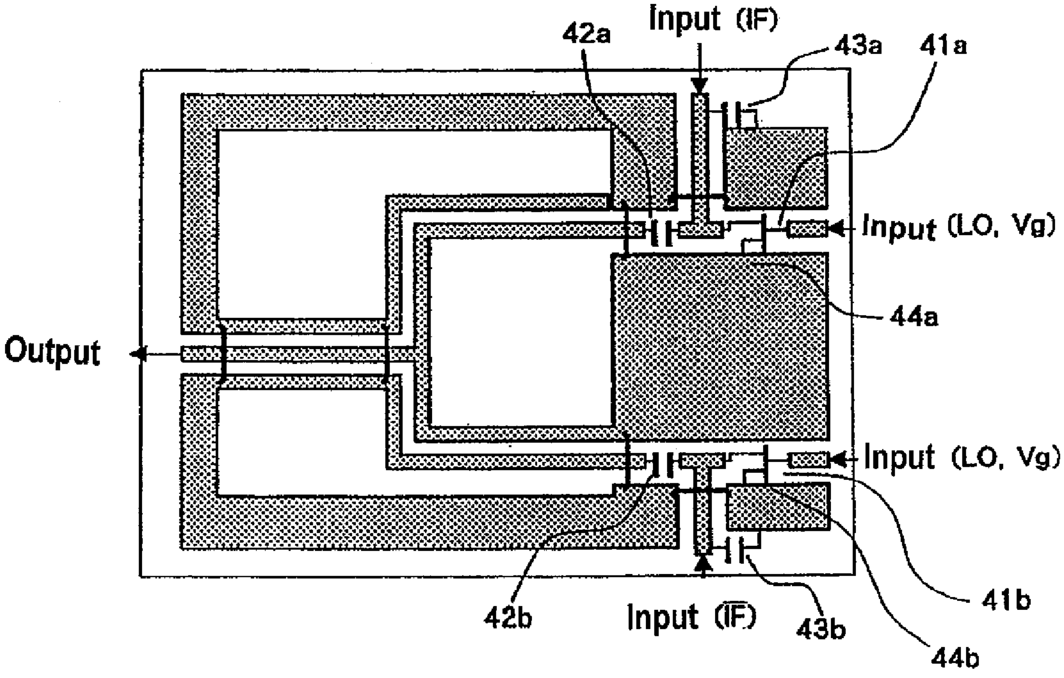
FIG. 7 is a plan view showing an exemplary configuration of an integrated circuit device according to the present invention.

As shown in FIG. 7, the integrated circuit device of this exemplary embodiment includes the balun circuit shown in FIG. 4, FETs 41*a* and 41*b*, each of which is a mixer element, capacitors 42*a* and 43*a* connected to FET 41*a*, and capacitors 42*b* and 43*b* connected to FET 41*b*.

The source electrode of FET 41*a*, which is a mixer element, is connected to the grounded conductor of the third CPW line, and the source electrode of FET 41*b*, which is a mixer element, is connected to the grounded conductor of the second CPW line. Each of the gate electrodes of FETs 41*a* and 41*b* is connected to an LO signal source and a bias (Vg) source. The drain electrode of FET 41*a* is connected to the center conductor of the third CPW line via capacitor 42*a*, and the drain electrode of FET 41*b* is connected to the center conductor of the second CPW line via capacitor 42*b*. Further, the drain electrode of FET 41*a* is connected not only to capacitor 43*a*, the other end of which is connected to the grounded conductor, but also to a stub having a predetermined length, and an IF signal is supplied through the stub. Similarly, the drain electrode of FET 41*b* is connected not only to capacitor 43*b*, the other end of which is connected to the grounded conductor, but also to a stub having a predetermined length, and an (opposite phase) IF signal is supplied through the stub. The capacitance (impedance) of each of capacitors 43*a* and 43*b* is open when viewed from the drain electrode side at the frequency of the RF signal, and set to a value at which the insertion loss is minimized at the frequency of the IF signal.

In such a configuration, an upper sideband signal, a lower sideband signal, and LO signals are outputted from the drain electrodes of FETs 41*a* and 41*b*, each of which is a mixer element. The upper sideband signal and the lower sideband signal undergo in-phase combination in the balun circuit, and the LO signals undergo opposite-phase combination in the balun circuit.

In the integrated circuit device of this exemplary embodiment, the source electrodes of FETs 41*a* and 41*b*, each of which is a mixer element, are connected to grounded conductors at connection sections 44*a* and 44*b*, and the grounded conductors have the same potential as described in the first exemplary embodiment. The operation condition of FET 41*a* is therefore the same as that of FET 41*b*, so that the LO signals outputted from FETs 41*a* and 41*b* have the same electric power.

Therefore, the LO signals outputted from FETs 41*a* and 41*b* undergo opposite-phase combination are cancelled in the balun circuit shown in FIG. 4, so that the electric power of each of the LO signals contained in the output signals is reduced. Further, according to this exemplary embodiment, the size of the balun circuit can be reduced, and hence the size of the integrated circuit device including the balun circuit can be reduced.

Although the fourth exemplary embodiment has been described with reference to the example in which the balun circuit of the first exemplary embodiment is used as a 180-degree phase combination device in a single-balanced mixer circuit, the balun circuits shown in the second and third exemplary embodiments can also be used as a 180-degree phase combination device in a single-balanced mixer circuit.

Further, the balun circuits shown in the first, second, and third exemplary embodiments can be used not only in the single-balanced mixer circuit shown in the exemplary embodiments, but also in any circuit in which it is necessary to impart 180-degree phase difference to two signals, such as a multiplier circuit and a differential amplification circuit. The use of any of the balun circuits shown in the first, second, and third exemplary embodiments allows reduction in circuit size of the entire integrated circuit device including the balun circuit.

Although the substrate on which any of the balun circuits shown in the first, second, and third exemplary embodiments is mounted is typically made of, for example, a dielectric or semiconductor material, the material of the substrate is not limited thereto.

The balun circuits shown in the first, second, and third exemplary embodiments have been described with reference to the case where an air bridge is used to connect the grounded conductors of each of the CPW lines and FCPW lines. The purpose of the air bridge is to stabilize the transmission mode of a signal in a CPW line. If the signal is reliably transmitted without loss, the grounded conductors of each of the CPW lines and FCPW lines are not necessarily connected to each other. Further, to connect the grounded conductors of each of the CPW lines and FCPW lines, an air bridges is not necessarily used, but a via hole or the like that connects the grounded conductors to another conductor disposed in the substrate or on the backside of the substrate may be used.

Moreover, although the first, second, and third exemplary embodiments have been described with reference to the case where CPW lines are used as the signal input/output ports, at least one of the CPW lines can be replaced with an FCPW line including a grounded conductor having a finite width.

The invention claimed is:

1. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said first CPW line and relaying a grounded conductor of said second CPW line to a grounded conductor of said first CPW line;

a second CPS line that is a differential transmission line, the second CPS line relaying a center conductor of said third CPW line to another grounded conductor of said first CPW line and relaying a grounded conductor of said third CPW line to the center conductor of said first CPW line; and a connection section that connects two or more of the grounded conductors of said first CPW line, the grounded conductor of said second CPW line, and the grounded conductor of said third CPW line.

2. The balun circuit according to claim 1, further comprising:

an FCPW line that is a non-differential transmission line;

a CPW-FCPW line converter that converts said first CPW line into said FCPW line;

an FCPW-CPS converter/splitter that converts said FCPW line into said first CPS line and said second CPS line; and a plurality of CPS-CPW converters, one of which converts said first CPS line into said second CPW line, another of which converts said second CPS line into said third CPW line.

3. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said first CPW line and relaying a grounded conductor of said second CPW line to a grounded conductor of said third CPW line;

a second CPS line that is a differential transmission line, the second CPS line relaying a center conductor of said third CPW line to a grounded conductor of said first CPW line and relaying the grounded conductor of said third CPW line to the grounded conductor of said second CPW line; and a connection section that connects two or more of the grounded conductors of said first CPW line, the grounded conductor of said second CPW line, and the grounded conductor of said third CPW line.

4. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said third CPW line and relaying a grounded conductor of said second CPW line to a center conductor of said first CPW line;

a second CPS line that is a differential transmission line, the second CPS line relaying the center conductor of said third CPW line to the center conductor of said second CPW line and relaying a grounded conductor of said third CPW line to a grounded conductor of said first CPW line; and a connection section that connects two or more of the grounded conductor of said first CPW line, the grounded conductor of said second CPW line, and the grounded conductor of said third CPW line.

5. The balun circuit according to claim 3, further comprising:

a third CPS line that is a differential transmission line, the third CPS line connected to the center conductor and to the grounded conductor of said first CPW line;

a CPW-CPS line converter that converts said first CPW line into said third CPS line;

a splitter that converts said third CPS line into said first CPS line and said second CPS line; and a plurality of CPS-CPW converters, one of which converts said first CPS line into said second CPW line, another of which converts said second CPS line into said third CPW line.

6. The balun circuit according to claim 1, wherein the length of said first CPS line differs from that of said second CPS line.

7. The balun circuit according to claim 1, wherein the length of said second CPW line differs from that of said third CPW line.

8. The balun circuit according to claim 1, wherein one or more lines from among said first CPW line, said second CPW line, and said third CPW line is an FCPW line.

9. The balun circuit according to claim 1, wherein a grounded conductor of said first CPW line is connected to a grounded conductor of said second CPW line and to a grounded conductor of said third CPW line.

10. An integrated circuit device comprising:

the balun circuit according to claim 1; and a plurality of three-terminal active elements connected to said second CPW line and to said third CPW line provided in said balun circuit.

11. The balun circuit according to claim 4, further comprising:

a third CPS line that is a differential transmission line, the third CPS line connected to the center conductor and to the grounded conductor of said first CPW line;

a CPW-CPS line converter that converts said first CPW line into said third CPS line;

a splitter that converts said third CPS line into said first CPS line and said second CPS line; and a plurality of CPS-CPW converters, one of which converts said first CPS line into said second CPW line, another of which converts said second CPS line into said third CPW line.

12. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said first CPW line and relaying a grounded conductor of said second CPW line to a grounded conductor of said third CPW line;

a second CPS line that is a differential transmission line, the second CPS line relaying a center conductor of said third CPW line to a grounded conductor of said first CPW line and relaying the grounded conductor of said third CPW line to the grounded conductor of said second CPW line; and a connection section that connects two or more of the grounded conductors of said first CPW line, the grounded conductor of said second CPW line, and the grounded conductor of said third CPW line;

wherein the length of said first CPS line differs from that of said second CPS line.

13. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said third CPW line and relaying a grounded conductor of said second CPW line to a center conductor of said first CPW line;

a second CPS line that is a differential transmission line, the second CPS line relaying the center conductor of said third CPW line to the center conductor of said second CPW line and relaying a grounded conductor of said third CPW line to a grounded conductor of said first CPW line; and a connection section that connects two or more of the grounded conductor of said first CPW line, the grounded conductor of said second CPW line, and the grounded conductor of said third CPW line;

wherein the length of said first CPS line differs from that of said second CPS line.

14. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said first CPW line and relaying a grounded conductor of said second CPW line to a grounded conductor of said third CPW line;

a second CPS line that is a differential transmission line, the second CPS line relaying a center conductor of said third CPW line to a grounded conductor of said first CPW line and relaying the grounded conductor of said third CPW line to the grounded conductor of said second CPW line; and a connection section that connects two or more of the grounded conductors of said first CPW line, the grounded conductor of said second CPW line, and the grounded conductor of said third CPW line;

wherein the length of said second CPW line differs from that of said third CPW line.

15. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said third CPW line and relaying a grounded conductor of said second CPW line to a center conductor of said first CPW line;

a second CPS line that is a differential transmission line, the second CPS line relaying the center conductor of said third CPW line to the center conductor of said second CPW line and relaying a grounded conductor of said third CPW line to a grounded conductor of said first CPW line; and a connection section that connects two or more of the grounded conductor of said first CPW line, the grounded conductor of said second CPW line, and the grounded conductor of said third CPW line;

wherein the length of said second CPW line differs from that of said third CPW line.

16. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said first CPW line and relaying a grounded conductor of said second CPW line to a grounded conductor of said third CPW line;

a second CPS line that is a differential transmission line, the second CPS line relaying a center conductor of said third CPW line to a grounded conductor of said first CPW line and relaying the grounded conductor of said third CPW line to the grounded conductor of said second CPW line; and a connection section that connects two or more of the grounded conductors of said first CPW line, the grounded conductor of said second CPW line, and the grounded conductor of said third CPW line;

wherein one or more lines from among said first CPW line, said second CPW line, and said third CPW line is an FCPW line.

17. A balun circuit comprising:

a first CPW line, a second CPW line, and a third CPW line that serve as signal input/output ports;

a first CPS line that is a differential transmission line, the first CPS line relaying a center conductor of said second CPW line to a center conductor of said third CPW line and relaying a grounded conductor of said second CPW line to a center conductor of said first CPW line;

a second CPS line that is a differential transmission line, the second CPS line relaying the center conductor of said third CPW line to the center conductor of said second CPW line and relaying a grounded conductor of said third CPW line to a grounded conductor of said first CPW line; and a connection section that connects two or more of the grounded conductor of said first CPW line, the grounded conductor of said second CPW line, and the grounded conductor of said third CPW line;

wherein one or more lines from among said first CPW line, said second CPW line, and said third CPW line is an FCPW line.

18. An integrated circuit device comprising:

the balun circuit according to claim 3; and a plurality of three-terminal active elements connected to said second CPW line and to said third CPW line provided in said balun circuit.

19. An integrated circuit device comprising:

the balun circuit according to claim 4; and a plurality of three-terminal active elements connected to said second CPW line and to said third CPW line provided in said balun circuit.

* * * * *